United States Patent [19]

Crumly

[11] Patent Number: 5,563,521
[45] Date of Patent: Oct. 8, 1996

[54] MEMBRANE CONNECTOR WITH STRETCH INDUCED MICRO SCRUB

[75] Inventor: William R. Crumly, Anaheim, Calif.

[73] Assignee: Hughes Aircraft Company, Los Angeles, Calif.

[21] Appl. No.: 349,271

[22] Filed: Dec. 5, 1994

Related U.S. Application Data

[62] Division of Ser. No. 55,463, Apr. 29, 1993, Pat. No. 5,395, 253.

[51] Int. Cl.$^6$ ..................................................... G01R 1/073
[52] U.S. Cl. ............................ 324/757; 324/754; 324/758
[58] Field of Search ................................... 324/757, 754, 324/72.5, 758, 761; 439/67

[56] References Cited

U.S. PATENT DOCUMENTS

| | | | |
|---|---|---|---|
| 4,636,722 | 1/1987 | Ardezzone | 324/754 |
| 4,820,976 | 4/1989 | Brown | 324/72.5 |
| 4,906,920 | 3/1990 | Huff et al. | 324/754 |
| 5,180,977 | 1/1993 | Huff | 324/754 |

Primary Examiner—Ernest F. Karlsen
Attorney, Agent, or Firm—E. E. Leitereg; T. Gudmestad; W. K. Denson-Low

[57] ABSTRACT

A membrane connector or test probe having a group of connector or test probe contacts (14) in a central contact section of the membrane (12) is initially stretched by being axially displaced from the plane of the peripheral membrane support (10). The test probe is cause to contact the pads (43,44) of device (42) to be tested and is then moved through an over travel distance that tends to decrease the amount of the stretch of the membrane. This decrease in stretch effects a small amount of lateral radial displacement of the test probe contacts to provide a scrubbing action that enhances electrical engagement with a circuit chip pad that may have a poorly conductive oxide coating. Substantially all of the stretch of the membrane is caused to be concentrated in and about the central contact section of the membrane at which the test probe contacts are located. This is accomplished by causing the area of the membrane between its peripheral support and the central section to be substantially inextensible as by bonding an inextensible metallic shield (50) to these portions of the membrane.

8 Claims, 3 Drawing Sheets

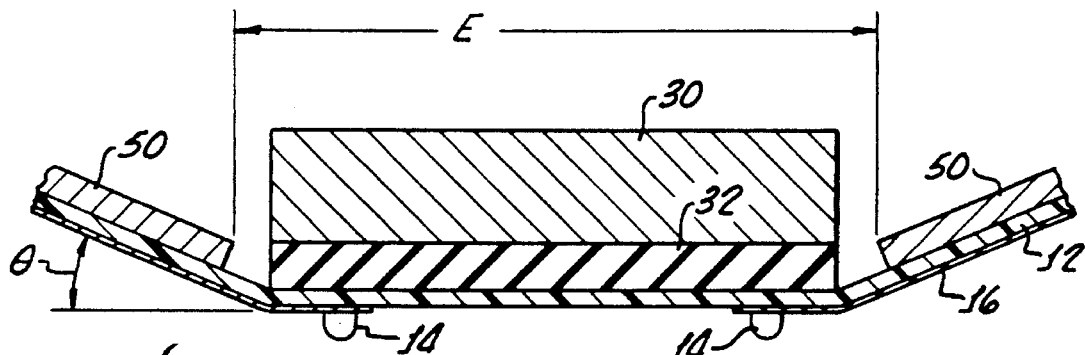
_FIG. 3._
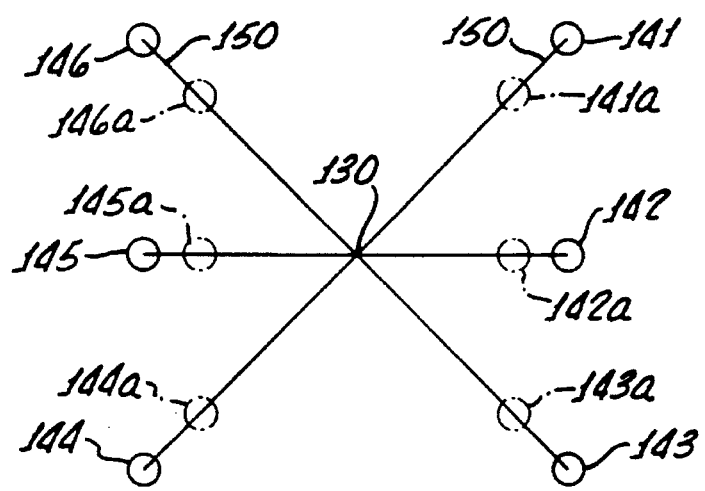
_FIG. 4._
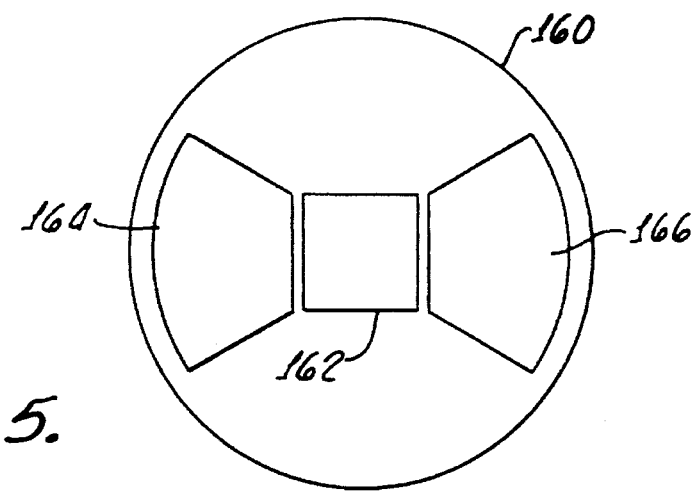
_FIG. 5._

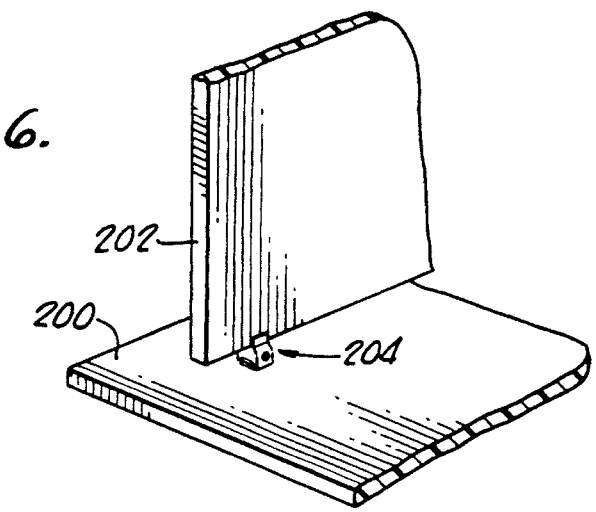
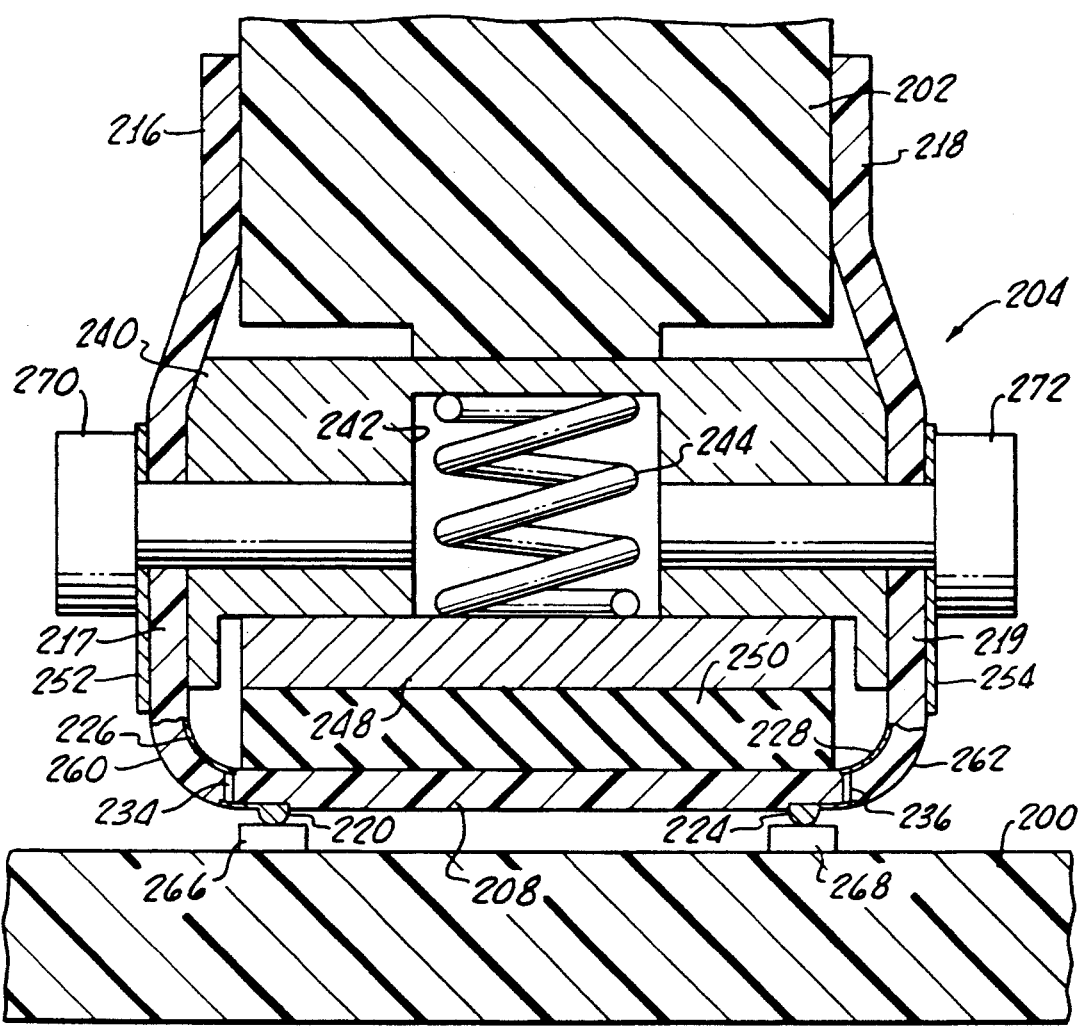

MEMBRANE CONNECTOR WITH STRETCH INDUCED MICRO SCRUB

This is a division of application Ser. No. 08/055,463, now U.S. Pat. No. 5,395,253 filed Apr. 29, 1993.

BACKGROUND OF THE INVENTION

1. Field of the Invention

The present invention relates to flexible membrane connectors and more particularly concerns membrane test connectors that provide a micro scrubbing action.

2. Description of Related Art

A significant application of the present invention concerns test probe connectors for use in testing of integrated circuits, and therefore a discussion of prior test probe connectors will provide a background for description of this aspect of the invention.

Integrated circuit chips are manufactured with large numbers of identical circuits on a single wafer which ultimately are separately cut from the wafer for use. It is desirable to test each circuit individually to determine whether or not it functions as intended before separating it from the wafer. Additional testing of separated circuits may be desired in various stages in assembly of a circuit and the finished apparatus. Further testing may be accomplished after packaging a circuit, after placing it in a multi-chip module, and after disassembly of a multi-chip module to identify inoperable circuits.

Conventional testing involves a probe card that is provided with a large number of small tungsten blades or needles that are mechanically and electrically connected to a circuit board and act as test probe contacts. Electrical leads extend from the contacts to the outer edge of the board for connecting the probe card to testing circuitry. In use of the blades or needles, they are moved into engagement with pads on an integrated circuit to be tested. The motion preferably should be such that there is a slight scrubbing action that is required for breaking through oxidation coating that often covers an aluminum, tin or solder type contact. Thus, blades or needles will effectively slide along or scrub the surface of the pad by a small amount to break the oxide coating. This provides a good electrical connection so that signals can be read to determine the integrity of the circuit on the chip. Proper scrubbing action is important, but difficult to obtain.

Ends of the test needles or blades must all fall in the same plane in order to assure that each one makes electrical contact with a pad of the integrated circuit. This is accomplished by bending the blades or needles after they have been mounted on the probe card, which, is laborious and time consuming, and expensive. Even after such adjustment, the blades or needles tend to creep back toward their original position so that their adjusted locations are lost. This lost of adjustment also comes about from the pressure of the needles against the chips, aggravated by the desired scrubbing action used to assure penetration of an oxide coating. As a result, constant maintenance is necessary or the probe cards will not perform their intended function. Even when in proper adjustment, the needles cannot compensate for significant differences in the heights of the contact pads on the integrated circuit chips being tested. The close spacing necessary for testing some chips cannot be achieved with conventional needle contacts. The needles may apply excessive force against the chip so as to damage the chips or their contact pads. This problem is greatly magnified by the fact that a single chip may require testing at different stages in its assembly into a finished module and that each such testing step requires a scrubbing action. In fact, some specifications will limit the number of times that a single chip that can be tested in order to avoid excessive chip damage caused by the testing operation itself.

Improved testing arrangements are disclosed in a co-pending application Ser. No. 606,676 filed Oct. 31, 1990, now U.S. Pat. No. 5,148,103, by John Pasiecznik, Jr. for Method and Apparatus for Testing Integrated Circuits and in a co-pending application Ser. No. 752,422, filed Aug. 30, 1991, now U.S. Pat. No. 5,264,787, by Blake F. Woith and William R. Crumly for Rigid Flex Circuits with Raised Features as IC Test Probe. Both of these applications are assigned to the same assignee as that of this application and both are incorporated herein by reference as though fully set forth.

In the above identified application of John Pasiecznik, Jr., a flexible membrane is stretched across a rigid angular substrate and provided with raised features on one side which connect through circuit traces to a probe card that is in turn connected to the test circuitry. During use of the membrane probe for testing, the membrane is distorted by air pressure or equivalent arrangements and contact of the membrane with the integrated circuit under test deflects the membrane to insure that raised contacts formed on the membrane are pressed against the pads of the integrated circuit to provide a good electrical connection. There has been no satisfactory way to obtain an adequate wiping or scrubbing action with the membrane probe of the Pasiecznik patent application. Deflection of the membrane during testing is too small to create an effective scrubbing action. Although the membrane of the above identified co-pending Applications is initially stretched and will experience a relaxation of the stretch during a small amount of over travel motion that follows initial touchdown of the test probe contact with the IC chip, the stretch of this membrane is distributed over the entire area of the membrane. In a typical membrane, having a radius of about one inch, the membrane is normally stretched by deflecting it downwardly by about 0.035 inches. This increases the total length along the membrane from its outer perimeter to its center by about 0.0005 inches. If engagement with a wafer or IC chip under test employs a 0.017 inch over travel, as is common, the total length of the membrane from the outer diameter to its center decreases by 0.00025 inches during over travel. However, this change in length is distributed over the full one inch radius of the membrane and, accordingly, is insignificant at any given single test probe contact, and will provide no effective scrubbing action.

Some connectors have been designed to produce a scrubbing action by moving the connector contact features or so-called gold dots to introduce a wiping action that occurs during contact. This has involved complicated cam or wedge mechanisms that are unreliable or costly and difficult to maintain. Furthermore, reliable wiping action requires a relatively large motion for the wiping. This impacts upon desired density of the connectors, making it difficult to utilize a test probe having contacts that are sufficiently close to one another.

Accordingly, is an object of the present invention to provide membrane connectors that minimize or avoid above-mentioned problems.

SUMMARY OF THE INVENTION

In carrying out principles of the present invention, in accordance with a preferred embodiment thereof, a membrane connector includes an elastic membrane stretched across a support with a plurality of connector contacts mounted on an intermediate contact section of the membrane. Means are provided for restraining stretch of a portion of the area o f the membrane between the support and the contact section and concomitantly permitting stretch of the membrane over the intermediate contact section. According to a feature of the invention, stretch of portions of the membrane is restrained by bonding a layer of a relatively inextensible material to certain portions of the membrane outside of the intermediate contact section.

To construct and use a circuit testing probe according to principles of the present invention, there is provided a flexible elastic membrane having a substantially planar unstressed condition and having an axis perpendicular to the plane of the membrane. Test probe contacts are positioned at a contact section on one side of the membrane in a pattern corresponding to that of pads on a device to be tested. Conductive means are provided on the membrane to extend from the test probe contacts to peripheral portions of the membrane for connection of contacts to a testing circuit. The peripheral portions of membrane are held in a predetermined configuration and the contact section of the membrane is axially displaced from an unstressed condition. This displacement causes stretching of the contact section and outward displacement of the test probe contacts. Concomitantly, stretch of portions of the flexible elastic membrane between the contact section and the peripheral portion is restrained. The probe with its stretched central section is moved to a device to be tested so as to press the probe contacts against pads of the device to be tested. This causes axial displacement of the contact section partly back toward its unstressed condition to thereby partly relax the radial stretch of the contact section. The relaxation causes the test probe contacts to be inwardly displaced as the test probe contacts engage the pads of the device to be tested, thereby providing a small amount of scrubbing of the test probe contacts against the pad.

BRIEF DESCRIPTION OF THE DRAWINGS

In the accompanying drawings:

FIG. 3 is an enlarged fragmentary view of portions of the central section of the membrane probe of FIGS. 1 and 2;

FIG. 4 illustrates certain aspects of the geometry of the scrubbing action of the described membrane test probe;

FIG. 5 illustrates an alternative inextensible shield configuration;

FIG. 6 illustrates another application of a membrane connector; and

FIG. 7 is an enlarged section of the membrane connector of FIG. 6.

DESCRIPTION OF PREFERRED EMBODIMENTS

Principles of the present invention are applicable to many different types and configurations of connectors that benefit from occurrence of a wiping action during connection. The invention takes advantage of stretching and/or relaxation of a connector membrane to produce lateral motion of contacts resulting in the desired wiping action. Therefore, principles of the present invention may be used in any arrangement in which a membrane or flexible elastic connector substrate may be used. The invention has been initially embodied in a membrane test probe using relaxation of the membrane to achieve wiping action and designed for testing integrated circuit chips, and, accordingly, will be first described in a test probe configuration.

Figure 1:
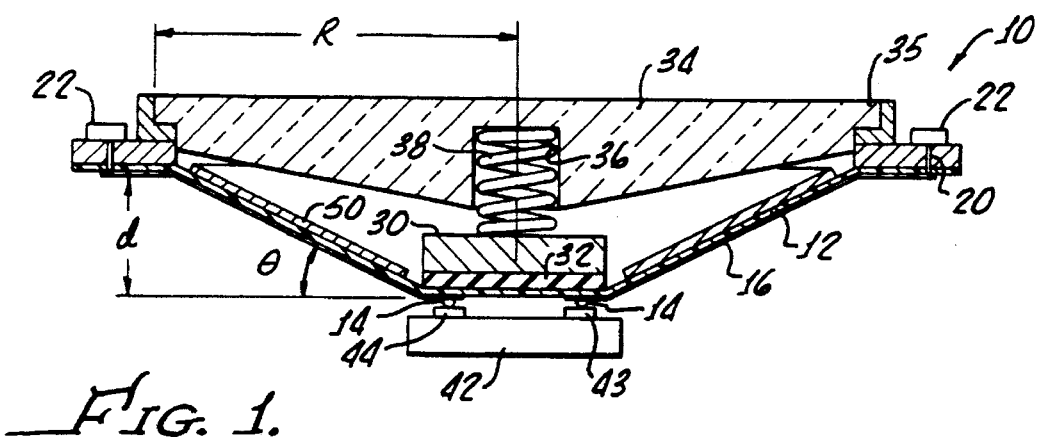
FIG. 1 is a simplified schematic side elevational section of portions of a membrane probe embodying principles of the present invention.
Figure 2:
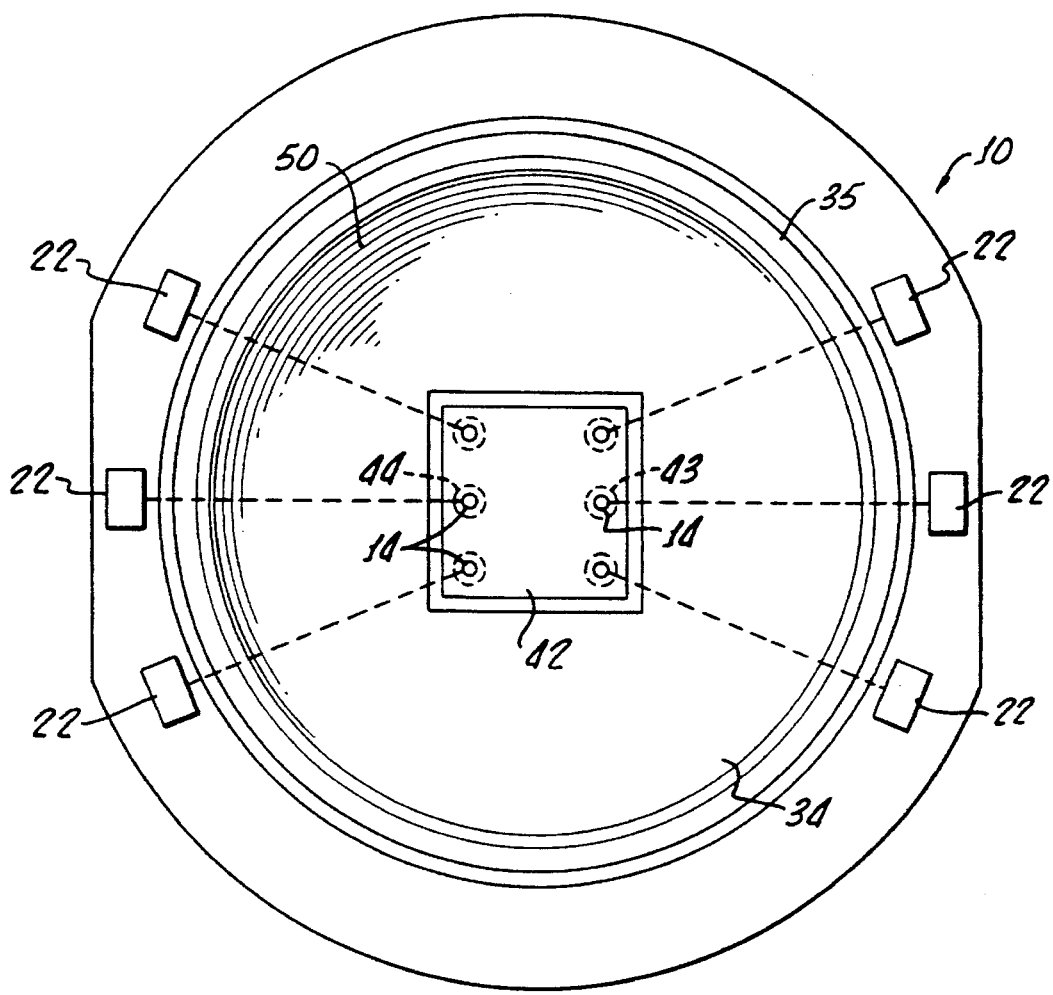
FIG. 2 is a plan view looking at the upper side of the probe of FIG. 1.

Illustrated in FIG. 1 are portions of a membrane probe that are fundamentally the same as those described in full detail in the above identified co-pending Applications. A membrane support frame in the form of a rigid angular substrate 10 is affixedly mounted on test equipment support structure (not shown) and formed of a suitable dielectric material such as photo-ceramic material, a polyimide or a phenolic resin. Secured to the substrate 10, as by an adhesive or other means, is a thin, flexible, elastic, transparent membrane 12 upon the lower surface of which, as viewed in the drawings, has been formed a plurality of test probe contacts 14 that are electrically connected with conductors 16 formed on the side of the membrane that bears the contact 14. It will be understood that although only six test probe contacts 14 are shown in FIGS. 1 and 2, the probe may have any suitable number of test probe contacts which are arranged in a pattern that is designed to be congruent with the pattern (commonly the edges of a rectangle) of pads to be contacted on an integrated circuit chip to be tested. The membrane is formed of a suitable dielectric material such as Kapton or other polyimide. The conductors individually extend from one of the probe contacts radially outwardly to a peripheral portion 18 of the membrane which peripheral portion is fixedly secured to the annular substrate. At the peripheral portion, individual conductors are connected by means of vias 20 extending through the annular substrate 10 to contact elements 22 on the other side of the substrate 10. Contact elements 22 connect to test circuitry (not shown). The membrane support frame 10 circumscribes a large circular opening across the entire area of which extends the elastic flexible membrane 12. Preferably the membrane is stretched tightly across the area circumscribed by the annular substrate 10. Nevertheless, both initially and increasingly with use, the membrane may tend to stretch and sag and thereby assume an undefined and unpredictable configuration.

To enable the membrane to be properly stretched and shaped and to provide a pressure backup for the central contact section that bears the test probe contacts 14, a rigid transparent platen 30 is mounted to the upper side of the membrane to extend substantially across and over the entire area of the central section at which the test probe contacts are mounted. To provide for variations in height or elevation of the various test probe contacts and/or the contact pads of the circuit chips to be tested, a resilient flexible elastomeric backup pad 32 is interposed between the rigid platen and the central section of the membrane. A fixed transparent back plate 34 extends across the annular substrate 10 and is fixed thereto. The back plate includes a blind recess 36 in which is mounted a compression spring 38 that is captured between and bears upon the inner end of the recess 36 and a central portion of the rigid transparent platen 30. Spring 38 resiliently urges the membrane, which is substantially planar in unstressed condition, downwardly away from the unstressed plane of the membrane to the illustrated stretched configuration. For a one inch radius membrane, for example, the distance d between the fixed peripheral portion of the membrane and the now lowered surface of the central section is about 0.035 inches.

The probe card, including membrane 12 and annular substrate 10, is arranged to be fixedly mounted to probe test structure (not shown) that provides signal connections from test circuitry to individual ones of the probe contacts 14 by the conductors 16, vias 20 and contact pads 22. The probe card may be secured to a test fixture by means and in the manner described in the above identified co-pending Applications. When mounted in the test fixture and pressed against an IC chip, the probe contacts will electrically connect the pads of the chip for transmission of test signals to and from the chip pads.

Probe test contacts 14 are all mounted in a substantially central section on the outer (lower as viewed in FIG. 1) surface of the membrane. The intermediate central, or contact section, occupied by the test probe contacts is a relatively small portion of the entire unsupported area of the membrane. For example, the contact area of the membrane may have a dimension of 0.30 inches on each side for a membrane having an overall diameter of two inches.

As previously mentioned, the membrane and the resilient elastomeric back up pad 32 are both elastic and will stretch as the membrane is pressed downwardly as urged by spring 38.

A membrane rigidifying shield 50 is bonded to the inner side of the membrane to make outer portions of the membrane inelastic.

Operation of the membrane probe first will be described without the presence of rigidifying shield 50 so as to explain limitations of a configuration in which the entire area of the membrane is elastic. In use of the described membrane probe (without shield 50), the probe is moved downwardly toward the surface of an IC chip 42 (FIG. 1) that is to be tested. The chip bears contact pads 43, 44. At touchdown the probe contact 14 initially engage the chip pads of 43, 44. Thereafter a predetermined amount of over travel, e.g. continuing downward motion of the probe, is provided in order to insure good firm contact. This over travel amount may be in the order of 0.017 inches in a typical probe testing arrangement. Initially, the spring displaces the membrane downwardly from an unstressed condition in which the membrane extends in a substantially planar arrangement across the substrate 20 to a fully stretched condition in which the central section of the membrane with its test probe contacts 14 has been displaced through a distance d which is approximately 0.035 inches. After touchdown the 0.017 inch over travel tends to return the membrane back toward its unstressed condition, effectively moving it back by the amount of the over travel distance. This over travel operation tends to relax part of the stretch of the membrane originally provided by the spring 38. In the course of this relaxation the several test probe contacts move radially inwardly. However, in a typical probe of the dimensions described herein, wherein the radius of the probe membrane is one inch and the deflection imparted by the spring 38 prior to contact with a device to be tested is 0.035 inches, the membrane has been stretched so that the total length from the outer periphery of the membrane to the center of the membrane has been increased. The 0.017 inch over travel decreases this total length by about 0.00025 inches. This amount of decrease in membrane length from its center to its periphery is distributed over the full one-inch radius of the exemplary membrane, and thus effects a lateral displacement of test probe contacts that is too small to cause any significant scrubbing motion in probe.

According to principals of the present invention, the stretch of the elastic membrane is confined to a small area in and about the central section at which the test probe contacts are mounted.

Other portions of the membrane are made inextensible and thus the entire 0.00025 inch change of length due to the 0.017 inch over travel is caused to occur substantially entirely within the central section of the flexible membrane.

Outer portions of the membrane, between the central contact bearing section and the peripheral support 10 are made inextensible and inelastic by application of the shield layer formed of a material such as copper, for example, indicated as shield layer 50 in FIGS. 1, 2 and 3. The copper shield layer, which may have a thickness of 0.0005 inches, for example, is much stiffer than the plastic membrane which may be made of the Kapton, for example. Stiffness of the copper is 40 times greater than stiffness of the Kapton membrane. The copper shield is bonded or otherwise fixedly attached to substantially the entire area of the membrane between its central contact section and the outer periphery, thereby forcing essentially all of the change in length due to the over travel distance to occur over only the central contact section of the membrane which is unsupported by any copper shield. The copper shield has an outer circular periphery that is close to or may extend into or under the annular substrate 10 and an inner periphery that is close to but spaced from the outer perimeter of the central contact section of the membrane. (see FIG. 2) The 0.00025 inch change in length along a radius of the one inch radius membrane is significant and effective when it occurs primarily between the contacts and the center 14 of the central section. The arrangement provides almost the full 0.00025 inch change in length for a scrubbing motion during the engagement and over travel.

FIG. 3 is an enlarged showing of parts of the central section of the membrane probe showing an angle Θ between the inelastic outer section of the membrane and the plane of the central section of the membrane when the probe membrane central section is fully displaced by the exemplary 0.035 inches. For the probe of the dimensions described herein this angle Θ is approximately two degrees. Accordingly, it will be readily appreciated that the magnitudes of displacements and the angles are greatly exaggerated in the drawings for clarity of illustration and to facilitate exposition.

FIG. 4 is an illustration of geometrical relations that will explain the radial displacement that causes the scrubbing action. FIG. 4 shows a central point 130 to be the center of the probe membrane and the center of the central contact section of the membrane. Probe test contacts 141, 142, 143, 144, 145, 146 are positioned on this central section and shown (in solid lines) in the fully stretched position, that is, prior to touchdown upon the pad of an IC chip. Test probe contacts 141 through 146 of FIG. 4 correspond to the test probe contacts 14 shown in FIGS. 1, 2 and 3. These test probe contacts are shown (in solid lines) in a radially outward displaced condition where they are positioned by the stretching of the central section of the membrane caused by action of spring 38. Prior to and just at touchdown the test probe contacts 141 to 146 are presumed to have the solid line positions illustrated in FIG. 4. After touchdown, motion of the probe continues to an over travel distance of 0.017 inches, thereby partially relaxing the stretch of the central contact section of the membranes. The test probe contacts are thereby radially inwardly displaced as they engage the pads of the device to be tested. Accordingly, at the end of the over travel, the probe contacts are in the positions illustrated in dotted lines as 141a through 146a inclusive. As the test probe contacts of the central section of the membrane touch down upon the IC clip pads 43, 44, the contacts move in the direction of the arrows 150 in FIG. 4. The distance between solid and dotted line position of the contacts is the magnitude of the scrubbing action. Tests of a membrane probe having the dimensions and configuration described herein show that the resultant scrubbing action causes a scrub mark that is approximately 0.00025 inches long. The length of the scrub mark may vary according to position of the contacts, being greater in a diagonal direction, as for contacts 141, 143, 144, 146 than in directions parallel to the sides of the rectangular probe pattern, as for contacts 142, 145, for example.

The shield layer 50 may be shaped to optimize the amount of scrub and/or the orientation of the scrub mark. FIG. 5 is a schematic illustration that shows an alternative arrangement of the nonelastic shielding applied to the membrane. For example, the diagram of FIG. 5 shows a circular membrane 160 having a central probe contact section 162. Inextensible and circumferentially discontinuous copper shields 164, 166 may be provided in the segmental configuration illustrated and extended in radial directions only toward the left and toward the right of the central contact section 62 with substantially no shield material above or below (as viewed in FIG. 5) the central contact section 162. With such a configuration, the membrane is substantially inextensible horizontally between its outer periphery and the perimeter of the central section 162 but is extensible vertically for its full diameter. With such a configuration, there is relatively little scrubbing motion in a vertical direction (as viewed in FIG. 5) so that substantially all of the scrubbing motion will take place in a horizontal direction.

Effectively, shape and location of the shield sections 164 and 166 of FIG. 5 confine stretch of the membrane contact section 162 to predetermined limited horizontal directions (as viewed in FIG. 5) and allow stretch in a vertical direction across its full diameter. Thus, there is relatively little, if any, vertical stretch of the membrane central section. All effective stretch of the central section 162 is confined to a substantially horizontal direction.

The shield layers of both FIG. 2 and FIG. 5 may also act as a electrical shield or ground layer for controlling impedance configurations of the membrane test circuitry.

Although principles of the invention have been first applied to a membrane test probe and have been described above in such application, it will be readily understood that the invention is applicable to many other types of flexible connectors. For example, flexible connectors of various types have been formed by laying down electrically conductive traces on a thin, flexible, elastic substrate and forming gold dots or bumps on an end of the traces to provide for pressure contacts. Flexible circuit connectors of this type are shown and described in U.S. Pat. No. 4,125,310 to Patrick A. Reardon, II; U.S. Pat. No. 4,116,517 to Selvane, et al.; and U.S. Pat. No. 4,453,795 to Moulin, et al. This type of flexible circuit connector may be employed in the electrical connection of a mother board 200 to a daughter board 202 in an arrangement such as illustrated in FIG. 6. In FIG. 6 portions of the mother board 200 are shown in relation to one of a plurality of daughter boards 202, which are effectively edge mounted to the mother board and physically and mechanically connected thereto by conventional means (not shown).

Electrical connections between the mother board 200 and the daughter board 202 are formed by a flexible circuit connector 204 comprising a ribbon or sheet of a flexible material having a plurality of circuit traces formed thereon which connect to raised dots or connector contacts. The flexible circuit of this edge connector is shown in detail in FIG. 7 and comprises a thin elastic membrane 208 forming a substrate which extends across the bottom of daughter board 202 and includes upwardly extending end portions 216,218 that are mechanically pressed against surfaces of the daughter board with suitable electrical connections (not shown in FIG. 7) interconnecting inner surfaces of the flexible substrate ends 216,218 with connections on outer surfaces of the daughter board. The flexible membrane 208 is formed with a plurality of raised dots or pressure contacts 220,224 connected to traces 226,228 on the inside or upper surface of the membrane 208. Traces 226,228 extend upwardly to connections on the inner surface of the membrane ends 216,218, which electrically connect to other contacts on the daughter board. Traces 226,228 are connected to the raised contacts 220,224 by means of short traces 230,232 on the outer surface of the membrane 208 and electrically conductive vias 234,236 extending through the membrane and connecting to traces 228,226.

Interposed between the thin flexible elastic membrane 208 and the lowermost edge of daughter board 202 and fixed to the daughter board is a board edge bar 240 that extends along at least portions of the edge of the daughter board and is formed with a recess 242 in which is mounted a compression spring 244. Interposed between the free or lower end of the spring 244 and the membrane 208 are a rigid platen 248 and a strip of elastomer 250 which bears upon the inner surface of the flexible membrane 208. Inextensible shield members 252,254, of rigid inelastic copper, for example, are bonded or otherwise fixedly secured to the outer surface of portions of the vertically extending membrane between the uppermost membrane end portions 216, 218 and the laterally outermost ends of the membrane central contact section that carries the contact dots 220,224. The intermediate section of the membrane 208 extends horizontally along the elastomer and then bends upwardly at either end of the elastomer at bend portions 260,262 to outer membrane sections 217,219 that are free of attachment to the mother board. It is to these outer sections, between bend portions 260,262 and the end portions 216,218, that the inelastic shield member is bonded. The shield members 252,254 extend from these bend portions of the membrane 260,262 upwardly along substantially all of the membrane that would be stretched by the action of spring 244 if the shield members were omitted. Fasteners 270,272 secure outer sections of the membrane to bar 240 but leave a substantial length of the membrane free of securement between the fasteners and bend portions 260,262.

Initially, before the daughter board has been connected to the mother board, the spring displaces the platen, elastomer and adjacent portions of the membrane downwardly away from the edge of the daughter board, or, more specifically, away from the lower side of edge bar 240. The edges of the membrane 216,218 are fixedly secured to the daughter board, and thus the displacement of the intermediate section of the membrane 208 results in a stretching of the membrane. However, because of the fixedly secured inelastic shield members 252,254, this stretching of the membrane occurs primarily in the intermediate section of the membrane between its two bend portions 260 and 262. When the daughter board is pressed down against the mother board to cause membrane contacts 220,224 to make electrical contact with contact pads 266,268 on the mother board, the intermediate section of the membrane is displaced upwardly, by the over travel, toward the edge of the daughter board to thereby relax some of the tension and some of stretching. As previously described, this causes a micro scrubbing action, which is a lateral displacement of the membrane mounted contacts 220,224, to cause a micro scrubbing action along contacts 266,268. Thus this flexible circuit connector arrangement operates to achieve a micro scrubbing action substantially in the same manner as does the flexible membrane probe described above and illustrated in FIGS. 1–5.

In the arrangement shown in FIG. 7 the membrane sections 217,219 may be made inextensible by being secured to sides of the edge bar 240, in which case shield members 252,254 may be omitted.

What is claimed is:

1. A membrane test probe comprising:

a perimetric support defining an open area, a membrane secured to and stretched tightly across said support open area, said membrane having an extensible contact section at a radially inward portion thereof and having relatively inextensible portions in said open area between said contact section and said support and radially inward of said support, said membrane being stretched tightly through said extensible contact section and through said relatively inextensible portions, a plurality of test probe contacts on said membrane at said extensible contact section, and means for elastically displacing said contact section from the plane of said perimetric support to thereby stretch said extensible contact section, whereby when said test probe contacts of said contact section are pressed against a device to be tested, displacement of the contact section is decreased to thereby decrease the stretch of said contact section and to laterally displace said test probe contacts.

2. The test probe of claim 1 wherein said membrane is elastic and wherein said relatively inextensible membrane portions include a layer of inextensible material bonded to the tightly stretched portion of said membrane at a portion of said open area between said contact section and said support.

3. The test probe of claim 2 wherein said layer of inextensible material comprises a shield layer of a metallic conductive material.

4. The test probe of claim 1 wherein said inextensible portions include means for restraining stretching of substantially all portions of said membrane between said contact section and said perimetric support.

5. The test probe of claim 1 including a plate secured to and extending across said perimetric support, an elastomeric backup layer secured to said membrane at said contact section, a platen positioned on said elastomeric layer, and wherein said means for displacing comprises means interposed between said plate and said platen for resiliently urging said contact section away from said plate.

6. A method of constructing and using a circuit testing probe to test a device having pads be contacted by the probe, said method comprising the steps of:

providing a flexible elastic membrane having a substantially planar unstressed condition and having an axis perpendicular to the plane of the membrane, securing test probe contacts at a central section on one side of said membrane in a pattern corresponding to that of pads on the device to be tested, extending conductor means on said membrane from said contacts to peripheral portions of said membrane for connection of said contacts to a testing circuit, fixedly holding and supporting said peripheral portions of said membrane in a predetermined configuration that defines an open area wherein the membrane is free of support, stretching said membrane from said peripheral supported portions tightly across said open area, axially displacing said central section from said unstressed condition to laterally stretch said central section, and to laterally outwardly displace said test probe contacts, restraining stretch of said flexible tightly stretched elastic membrane across said open area at portions radially inward of said supported portions and between said central section and said peripheral supported portions, and moving said probe to a device to be tested so as to press said test probe contacts against pads of the device to be tested, said step of moving comprising axially displacing said central section back toward said unstressed condition to thereby partly relax the radial stretch of said central section and to radially inwardly displace said test probe contacts as said test probe contacts engage the pads of the device to be tested, thereby providing a small amount of scrubbing of said test probe contacts against said pads.

7. The method of claim 6 wherein said step of restraining stretch comprises securing a thin layer of inextensible material to said tightly stretched membrane at membrane portions that are stretched across said open area radially outward of said central section.

8. The method of claim 6 wherein said step of restraining stretch comprises securing a layer of inextensible material to said membrane at membrane portions that are of limited circumferential extent and extend radially outwardly of said central section.

* * * * *